United States Patent
Kim et al.

(10) Patent No.: US 9,087,608 B2
(45) Date of Patent: Jul. 21, 2015

(54) METHOD OF PROGRAMMING NON-VOLATILE MEMORY DEVICE AND NON-VOLATILE MEMORY DEVICE USING THE SAME

(71) Applicant: Samsung Electronics Co., Ltd., Suwon-Si, Gyeonggi-Do (KR)

(72) Inventors: Moosung Kim, Yongin-si (KR); Ohsuk Kwon, Yongin-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 14/614,992

(22) Filed: Feb. 5, 2015

(65) Prior Publication Data

US 2015/0146485 A1     May 28, 2015

Related U.S. Application Data

(60) Division of application No. 13/949,833, filed on Jul. 24, 2013, which is a continuation of application No. 12/461,934, filed on Aug. 28, 2009, now Pat. No. 8,508,996.

(30) Foreign Application Priority Data

Oct. 21, 2008 (KR) .................. 10-2008-0103198

(51) Int. Cl.
| | |
|---|---|
| *G11C 16/10* | (2006.01) |
| *G11C 11/56* | (2006.01) |
| *G11C 7/10* | (2006.01) |

(52) U.S. Cl.
CPC ............ *G11C 11/5628* (2013.01); *G11C 16/10* (2013.01); *G11C 7/1048* (2013.01)

(58) Field of Classification Search
CPC ........ G11C 16/10; G11C 16/30; G11C 16/12; G11C 16/0483; H01L 27/115
USPC ..................................... 365/185.18
See application file for complete search history.

(56) References Cited

U.S. PATENT DOCUMENTS

| | | | |
|---|---|---|---|
| 6,031,764 | A | 2/2000 | Imamiya et al. |
| 6,894,931 | B2 | 5/2005 | Yaegashi et al. |
| 2008/0049494 | A1 | 2/2008 | Aritome |
| 2008/0089130 | A1* | 4/2008 | Park .................. 365/185.18 |
| 2008/0106946 | A1 | 5/2008 | Inoue et al. |
| 2009/0086542 | A1 | 4/2009 | Lee et al. |

FOREIGN PATENT DOCUMENTS

| | | |
|---|---|---|
| JP | H10241388 A | 9/1998 |
| JP | 2000048581 A | 2/2000 |
| JP | 2000251485 A | 9/2000 |
| JP | 2000348494 A | 12/2000 |
| JP | 2007042166 A | 2/2007 |
| KR | 20050108136 A | 11/2005 |
| KR | 20060108324 A | 10/2006 |

\* cited by examiner

*Primary Examiner* — Jason Lappas
(74) *Attorney, Agent, or Firm* — Harness, Dickey & Pierce

(57) ABSTRACT

A program method of a nonvolatile memory device according to example embodiments includes a operation (a) of detecting a level of a program voltage; and a operation (b) of providing a unselected word line voltage and a bit line precharge voltage having a variable level respectively according to the detected level of the program voltage.

10 Claims, 12 Drawing Sheets

METHOD OF PROGRAMMING NON-VOLATILE MEMORY DEVICE AND NON-VOLATILE MEMORY DEVICE USING THE SAME

CROSS-REFERENCE TO RELATED APPLICATIONS

This application is a Divisional of U.S. application Ser. No. 13/949,833, filed on Jul. 24, 2013, which is Continuation of U.S. application Ser. No. 12/461,934, filed on Aug. 28, 2009, and issued as U.S. Pat. No. 8,508,996 on Aug. 13, 2013, which claims priority under 35 U.S.C. §119 to Korean Patent Application No. 10-2008-0103198, filed on Oct. 21, 2008, in the Korean Intellectual Property Office (KIPO), the entire contents of which are hereby incorporated herein by reference.

BACKGROUND

The example embodiments disclosed herein relate to semiconductor memory devices, and more particularly, to nonvolatile memory devices and methods of programming the same.

Semiconductor memory devices are classified into volatile semiconductor memory devices and nonvolatile semiconductor memory devices. The volatile semiconductor memory devices have a high read speed and a high write speed. However, the volatile semiconductor memory devices lose their stored data when their power supplies are interrupted. In contrast, the nonvolatile semiconductor memory devices retain their stored data even when their power supplies are interrupted. Thus, the nonvolatile semiconductor memory devices are used in memorizing data which should be kept regardless of whether a power supply is supplied or not.

Since flash memories, which are among the nonvolatile memory devices, have a function electrically erasing cell data in a lump, they are widely used in a computer and a memory card. Flash memories are classified into a NOR type and a NAND type according to a condition of a connection between cells and a bit line. A NOR type flash memory is a memory in which at least two cell transistors are connected to one bit line in parallel. The NOR type flash memory may store data using a channel hot electron method and erases data using a Fowler-Nordheim Tunneling method. In contrast, a NAND type flash memory is a memory in which at least two cell transistors are serially connected to one bit line. The NAND type flash memory may store program data and erases data using F-N tunneling method.

In NAND type flash memory device, the cells that are connected to a selected word line and not to be programmed may be soft-programmed by a program voltage applied to the selected word line, due to characteristics of the cell structure as widely known.

In program operation of NAND type flash memory, a high program voltage (e.g., 20V) is applied to a word line connected to selected memory cells. As a result of the program operation, a threshold voltage of the selected memory cells is changed to have a high level, or kept at a previous level according to data written in the memory cells. Memory cells, from among the selected memory cells, that keep a previous threshold voltage (referred to as a program-inhibited cell) experience a bias condition which is referred to as a program inhibit. Generally, the F-N tunneling phenomenon may be prevented in the selected memory cells that are not to be programmed by increasing the channel potential so as to reduce the strength of an electric field applied to a charge storage layer. The program-inhibited cell may be soft-programmed by a high program voltage due to characteristics of the cell structure of NAND flash memory. The soft-program is called a program disturbance. Also, a pass voltage (Vpass) is provided to unselected word lines. The pass voltage (Vpass) applied to unselected memory cells connected to a string that is be programmed may cause an unintended programming of unselected memory cells due to a potential difference between a channel voltage and the pass voltage. The unintended programming is called a pass disturbance.

SUMMARY

Example embodiments provide a program method of a nonvolatile memory device. The program method may comprise a operation (a) of detecting a level of a program voltage; and a operation (b) of providing an unselected word line voltage and a bit line precharge voltage having a variable level respectively according to the detected level of the program voltage.

Example embodiments provide a memory system. The memory system may comprise a nonvolatile memory device programming memory cells according to a program method including a operation (a) of detecting a level of a program voltage and a operation (b) of providing a unselected word line voltage and a bit line precharge voltage having a variable level respectively according to the detected level of the program voltage, and a memory controller for controlling the nonvolatile memory device.

BRIEF DESCRIPTION OF THE FIGURES

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Figure 1:
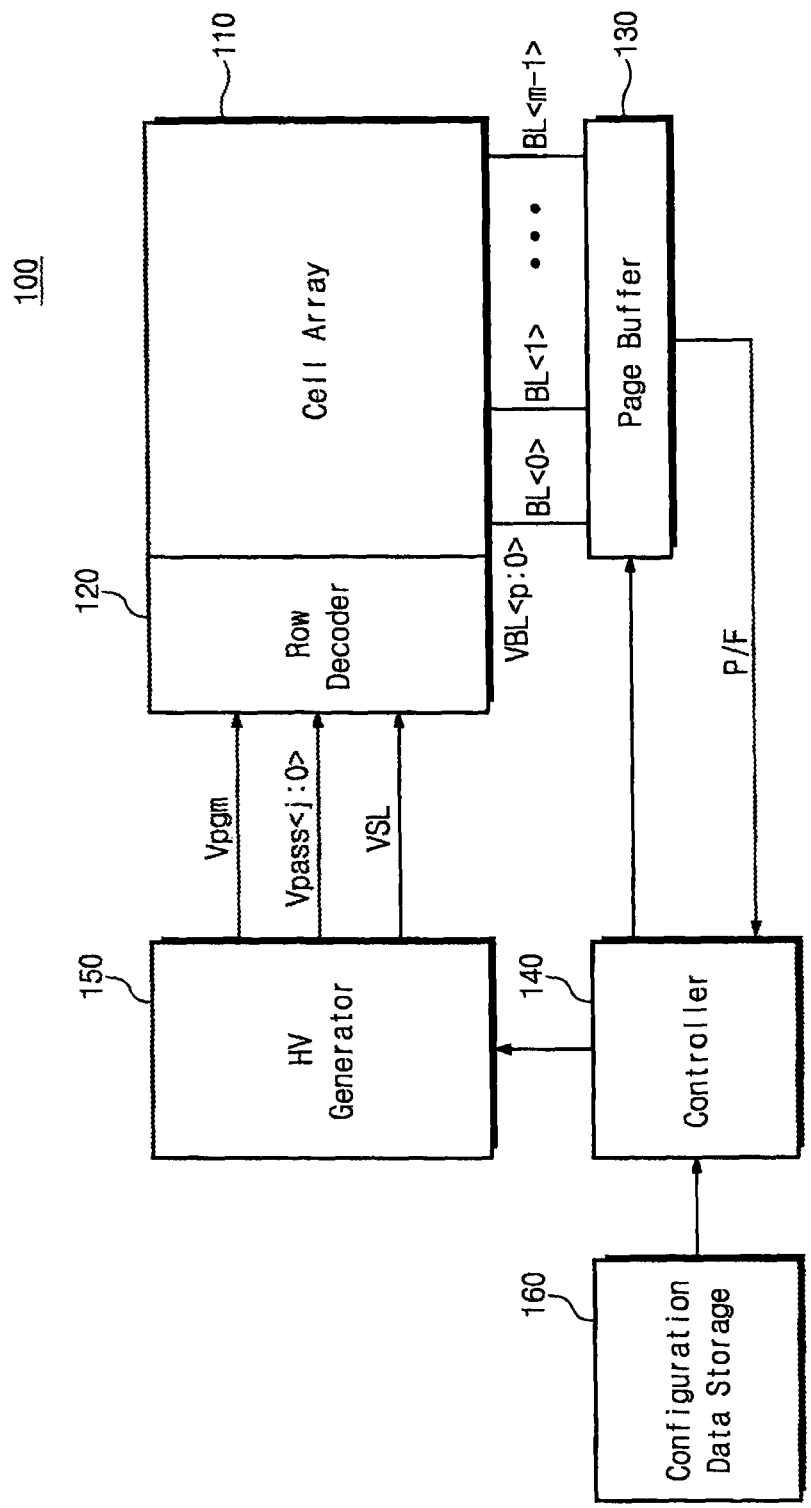
FIG. 1 is a block diagram of a flash memory device according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a block diagram of a flash memory device according to example embodiments. Referring to FIG. 1, a flash memory device 100 provides a word line and a bit line that can reduce a program disturbance and a pass disturbance when a program operation is performed. The flash memory device 100 includes a cell array 110, row decoder 120, page buffer 130, a controller 140, a high voltage generator 150 and a configuration data storage 160.

The cell array 110 may include a plurality of bit lines (BL<0>~BL<m-1>), a plurality of word lines (WL<0>~WL<n-1>, not shown) and a plurality of memory cells disposed on a region where the bit lines and the word lines are crossed. According to example embodiments, when a program operation is performed, a voltage level, which is varied depending on a level of the program voltage (Vpgm), is applied to the unselected word lines and to the bit line of a program inhibited string. A channel boosting voltage of a program inhibited string may be sufficiently increased through the program environment without an excessive increase of the pass voltage (Vpass). Thus, the pass voltage (Vpass) may be lowered and the lowered pass voltage (Vpass) may reduce a pass disturbance of a program string.

The row decoder 120 transmits a high voltage provided from a high voltage generator 150 to word lines and selection lines (SSL, GSL) in response to a row address (not shown). The row decoder 120 performs a decoding function decoding row addresses of a memory cells to be programmed and a word line selection function selecting a word line corresponding to the decoded address. The row decoder 120 also performs a function applying a high voltage provided from the high voltage generator 150 to a selected word line and unselected word lines. The row decoder 120 applies a program voltage (Vpgm) to a selected word line and apply a pass voltage (Vpass<j:0>, j is natural number) to unselected word lines when a program operation is performed. According to example embodiments, row decoder 120 provides a pass voltage (Vpass<j:0>) that can be varied according to a level of a program voltage (Vpgm) to unselected word lines.

The page buffer 130 performs a function of storing data in the cell array 110 or a function of reading data stored in the cell array 110. The page buffer 130 may be connected to the cell array 110 through a plurality of bit lines (BL<0>~BL<m-1>). The page buffer 130 applies a ground voltage (0V) or a bit line precharge voltage (Vcc or Vcc+α) to a bit line depending on a value of data to be programmed when a program operation is performed. For example, the page buffer 130 may apply a ground voltage (0V) to a bit line of a memory cell in which logic '0' is programmed. The page buffer 130 may apply a bit line precharge voltage (Vcc or Vcc+α) to a bit line (a bit line of a program inhibited string) of a memory cell in which logic '1' is programmed. The page buffer 130 may also provide a pass/fail signal (P/F) having information on pass or fail of a program operation to the controller 140 through a column scan operation.

The controller 140 selects a voltage to be applied to the word lines (WL<0>~WL<n-1>) and the selection lines (SSL, GSL) by referring to information provided from the configuration data storage 160. The controller 140 detects a configuration data of the configuration data storage 160 and a level of a program voltage to be provided from a present program operation or a present program loop. The controller 140 selects levels of a pass voltage (Vpass<j:0>) and a bit line precharge voltage (VBL<p:0>, p is natural number) for a program operation according to a level of a detected program voltage (Vpgm). According to example embodiments, when a level of a program voltage (Vpgm) to be provided from a present program loop is low, the controller 140 controls the high voltage generator 150 and the page buffer 130 so as to provide a pass voltage (Vpass<j:0>) of a low level and a bit line precharge voltage (VBL<p:0>) of a low level. As the number of a program loop increases and a level of a program voltage (Vpgm) to be provided from a present program loop gets higher, the controller 140 controls the high voltage generator 150 and the page buffer 130 so as to provide a pass voltage (Vpass<j:0>) of a high level and a bit line precharge voltage (VBL<p:0>) of a high level. Here, a gate voltage of the string selection transistor (SST) may be provided at a higher level so as to increase a voltage at which a bit line of a program inhibited string is precharged by a bit line precharge voltage (VBL<p:0>). That is, in order to increase a precharge voltage of a program inhibited string, a selection voltage (VSL=Vcc+α) of the string selection line (SSL) may be provided to be higher than the power supply voltage (Vcc) by synchronizing with the bit line precharge voltage (VBL<p:0>).

The high voltage generator 150 generates all word line voltages (Vpgm, Vpass<j:0>) and a selection line voltage (VSL) required to perform a program operation. Generally, a voltage higher than a power supply voltage (Vcc) provided from the outside may be applied to a word line. The high voltage generator 150 may include a plurality of charge pumps to generate various levels of high voltages from a power supply voltage provided from the outside. However, only voltages provided to the word lines (WL<0>~WL<n-1>) and the selection lines (SSL, GSL) used when a program operation according to example embodiments is performed will be described. The high voltage generator 150 provides a pass voltage (Vpass<j:0>) to the unselected word lines in response to a control of the controller 140. The pass voltage (Vpass<j:0>) may be varied during a plurality of program loops in which a program voltage (Vpgm) is applied to the selected word line. Here, a blocking voltage may be provided to a word line adjacent to the selected word line to perform a self boosting. However, the high voltage generator 150 generates a pass voltage (Vpass<j:0>) so that a level of the pass voltage (Vpass<j:0>) applied to unselected word lines is varied according to an amplitude of a program voltage (Vpgm). Also, the high voltage generator 150 may provide a selection voltage (VSL) to the string selection line (SSL) so that a level of the selection voltage (VSL) becomes Vcc+α higher than a power supply voltage (Vcc).

The configuration data storage 160 provides basic information for determining a point of time at which to vary a level of a pass voltage (Vpass<j:0>) and a level of a bit line precharge voltage (VBL<p:0>). The configuration data storage 160 may provide information about a target state at which selected memory cells are programmed, or about the number of program loops or the number of a steps. The configuration data storage 160 may be embodied by a fuse, e-fuse or the like. The configuration data storage 160 may include resistors. When the flash memory device 100 is turned on, basic information stored in the cell array 110 may be readout and then stored in the resistors. Referring to configuration data being provided from the configuration data storage 160, the controller 140 detects a level of a program voltage (Vpgm) to be provided from a present program operation and determine a point of time at which to vary a level of a pass voltage (Vpass<j:0>) and a level of a bit line precharge voltage (VBL<p:0>).

The NAND flash memory device 100 may provide a pass voltage (Vpass<j:0>) and a bit line precharge voltage (VBL<p:0>) varied according to a level of a program voltage (Vpgm) provided to a selected word line. Thus, a channel voltage of a program inhibited string may be precharged to a high level. As a result, a boosting voltage of a channel in the program inhibited string may be set to a high level. The flash memory device 100 may improve a characteristic of a program disturbance together with the construction described above. Also, since a pass voltage (Vpass<j:0>) provided to perform a boosting of a channel may be set to a low level, an unintended soft program phenomenon due to a pass voltage may be prevented.

Figure 2:
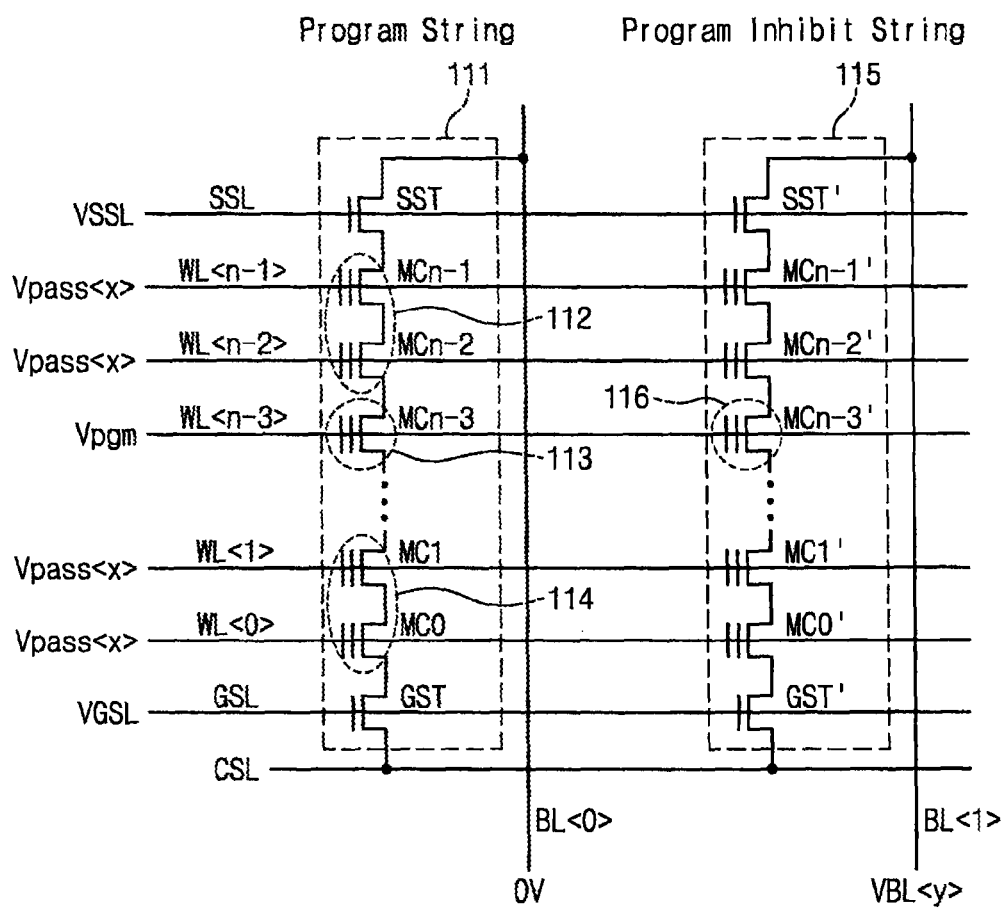
FIG. 2 is a circuit of a structure of a cell array of FIG. 1.

FIG. 2 is a circuit of a structure of a cell array of FIG. 1. Referring to FIG. 2, the cell array 110 may includes a plurality of cell strings 111 and 115. Each string has a string selection transistor (SST) connected to a bit line, a ground selection transistor (GST), and a plurality of cell transistors (MC0~MCn-1) serially connected between the string selection transistor (SST) and the ground selection transistor (GST). The cell string 111 are connected between a bit line (BL<0>) and a common source line (CSL), and the cell string 115 is connected between a bit line (BL<1>) and a common source line (CSL).

The cell string 111 is connected to a bit line (BL<0>). In the cell string 111, a ground selection transistor (GST), a plurality of memory cells (MC0~MCn-1) and a string selection transistor (SST) are serially connected. The ground selection transistor (GST) is connected to the common source line (CSL) and the string selection transistor (SST) is connected to the bit line (BL<0>). The plurality of memory cells (MC0~MCn-1) is connected between the ground selection transistor (GST) and the string selection transistor (SST). Here, the number of memory cells connected to one string may be changed to be, for example, 16, 32, 64 or the like. The cell string 115 may also have the same circuit structure as the cell string 111.

A plurality of word lines is connected to gates of the plurality of memory cells (MC0~MCn-1) respectively, and a string selection line (SSL) is connected to a gate of the string selection transistor (SST). A ground selection line (GSL) is connected to the ground selection transistor (GST).

Assume that a program operation is performed to program the memory cell 113 and to inhibit the memory cell 116. A program voltage (Vpgm, for example, 18V) is applied to a selected word line (WL<n-3>) and a pass voltage (Vpass<x>) is applied to unselected word lines (WL<0>~WL<n-4>, WL<n-2>~WL<n-1>). According to example embodiments, the cell string 111 is a program string and the cell string 115 is a program inhibit string.

Before performing a program, a range of a program voltage (Vpgm) is detected by the controller 140. When the range of the program voltage (Vpgm) is detected, the controller 140 determines a pass voltage (Vpass<x>, 0≤x≤j) and a precharge voltage (VBL<y>, 0≤y≤p). When a program operation begins, a ground voltage (0V) is applied to a bit line (BL<0>) of the program string 111 and a bit line precharge voltage (VBL<y>) is applied to a bit line (BL<1>) of the program inhibited string 115. A channel of the program inhibited string is floated and boosted by a coupling. A memory cell (116, MCn-3') connected to the selected word line (WL<n-3>) is not programmed by a channel electric potential of the boosted program inhibited string. In contrast, a memory cell (113, MCn-3) connected to the selected word line (WL<n-3>) is programmed.

The pass voltage (Vpass<x>) and the precharge voltage (VBL<y>) of the program inhibited string depend on a level of the program voltage (Vpgm). When the level of the program voltage (Vpgm) is low, a soft program of a memory cell 116 may not occur even though a channel boosting voltage of the program inhibited string 115 is low. However, if the level of the program voltage (Vpgm) is high and the channel boosting voltage is not sufficiently high, a program disturbance in which the memory cell (116, MCn-3') becomes soft programmed may occur.

In a program method according to example embodiments, when the program voltage (Vpgm) is high, the channel boosting voltage may be sufficiently increased by increasing the precharge voltage (VBL<y>) of the program inhibited string. The channel boosting is less dependent on the pass voltage (Vpass<x>) and a relatively low pass voltage (Vpass<x>)

may be provided. A pass disturbance of memory cells 112 and 114 may be blocked by the relatively low pass voltage (Vpass<x>).

Figure 3A:
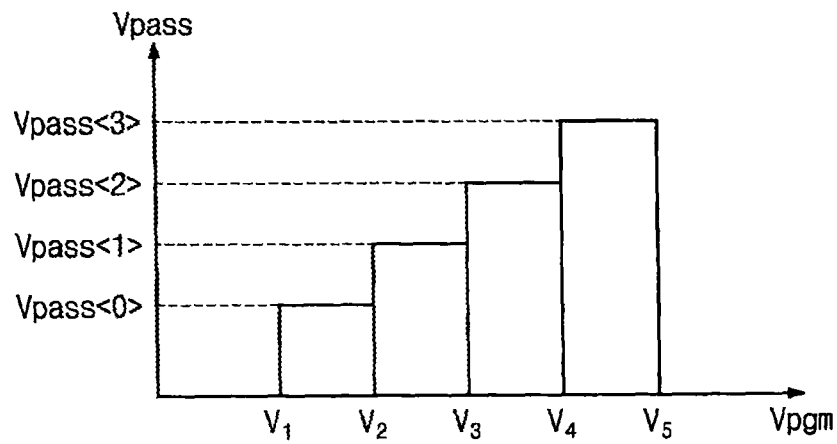
FIGS. 3a and 3b are drawings illustrating changes of a pass voltage and a bit line precharge voltage respectively.

FIG. 3a is a graph illustrating a level of the pass voltage (Vpass<x>) that can be varied according to a level of the program voltage (Vpgm). Referring to FIG. 3a, as a level of the program voltage (Vpgm) increases, a level of the pass voltage (Vpass<x>) is gradually increased. In a scheme where a pass voltage (Vpass) of a fixed level is provided regardless of a level of the program voltage (Vpgm), a pass disturbance of unselected memory cells included in the program string may be inevitable. However, according to example embodiments, when a level of the program voltage (Vpgm) is low (e.g., V1≤Vpgm≤V4), pass voltages (e.g., Vpass<0>, Vpass<1>, Vpass<2>) of a level lower than the previous fixed pass voltage (Vpass) are provided. A voltage stress which unselected memory cells of the program string receive may be reduced by providing the low pass voltages (e.g., Vpass<0>, Vpass<1>, Vpass<2>).

Figure 3B:
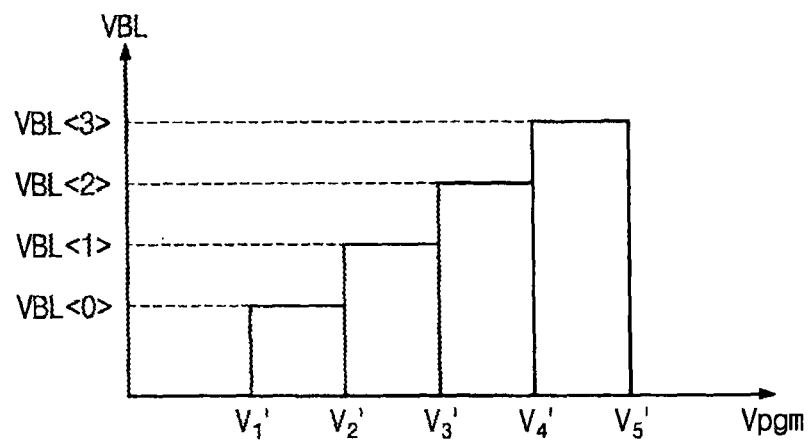

FIG. 3b is a graph illustrating a level of a bit line precharge voltage (VBL<y>) that can be varied according to a level of the program voltage (Vpgm). Referring to FIG. 3b, as a level of the program voltage (Vpgm) increases, the precharge bit line voltage (VBL<y>) provided to a bit line of the program inhibited string is gradually increased. In a scheme in which the bit line precharge voltage (VBL) of a fixed level is provided regardless of a level of a program voltage (Vpgm), a pass disturbance which occurs in memory cells included in the program inhibited string and receiving the program voltage may be inevitable. However, according to example embodiments, when a level of the program voltage (Vpgm) is low (V1'≤Vpgm<V2'), a relatively low bit line precharge voltage (VBL<0>) is provided. If the program voltage (Vpgm) increases, the bit line precharge voltage is increased so as to increase a level of a boosting voltage of a channel. That is, if a high bit line precharge voltage is provided, the channel is floated in a channel voltage higher than before. Due to a high floating voltage of the channel, when a program voltage is provided, the channel may be boosted in a relatively high channel voltage by a coupling of a gate and the channel. Even though the program voltage becomes high, an electric potential difference between the gate and the channel is reduced because a boosting voltage of the channel is also increase together with the program voltage. Thus, an unintended soft program phenomenon due to the program voltage may be prevented. Here, to increase precharge voltage level of the channel of the program inhibited string, a gate voltage of the string selection transistor SST may be increased according to the level of the bit line precharge voltage.

Figure 4:
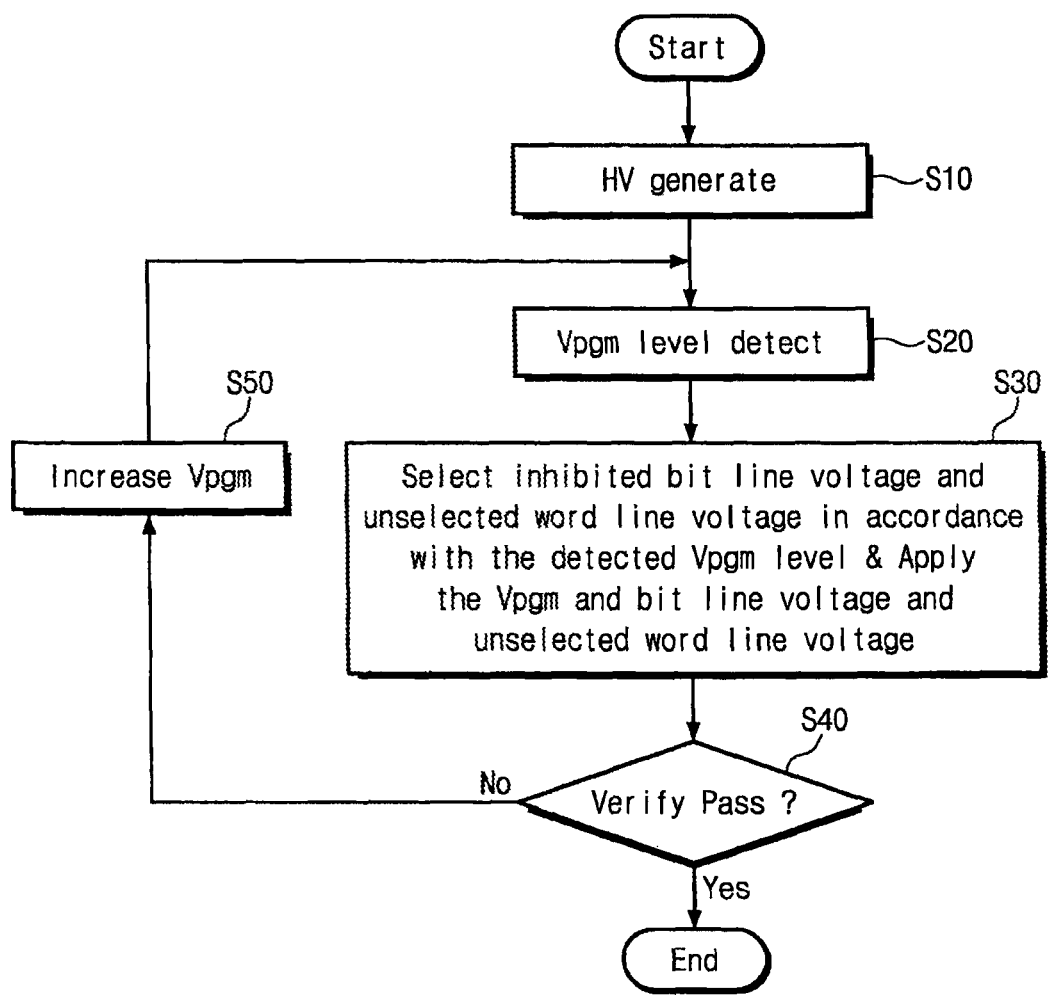
FIG. 4 is a flow chart illustrating a rough process of a program method according to example embodiments.

FIG. 4 is a flow chart roughly illustrating a program operation according to one example of embodiments. Referring to FIG. 4, a level of a program voltage provided at every program operation is detected and a pass voltage (e.g., Vpass<x>), which is to be provided to an unselected word line, and a bit line precharge voltage (VBL<y>), which is to be provided to a bit line of a program inhibited string, are variably provided according to a level of a detected program voltage (Vpgm).

When a program operation begins, a high voltage is generated by the high voltage generator 150. The high voltage may include word line voltages of various levels. That is, a program voltage, a pass voltage and a selection line voltage of various levels may be included in the high voltage (S10). A level of the program voltage (Vpgm) to be applied to the selected word line in a current program operation is detected by the controller 140. A detection of the level of the program voltage (Vpgm) may be performed by a method of directly measuring an output voltage of the high voltage generator 150, and may also be performed using other various methods. That is, a level of the program voltage (Vpgm) may be detected by checking a step count of the program voltage provided from the current program operation. Also, a level of the program voltage (Vpgm) may be detected through an operation of checking a target state in the current program operation. A level of the program voltage (Vpgm) in the current program operation may also be detected by referring to the number of loops in the current program operation or verification read result of a previous loop (S20).

When a level detection of the program voltage (Vpgm) is completed, a bit line voltage (VBL<y>) of the program inhibited string corresponding to a level of the detected program voltage (Vpgm) and the pass voltage (e.g., Vpass<x>) to be provided to an unselected word line are selected. Also, the bit line precharge voltage (VBL<y>) of a selected level is provided to a bit line of a program inhibited string and then the pass voltage (Vpass<x>) of a selected level is applied to the unselected word line. A program operation is performed by providing the program voltage (Vpgm) to a selected word line.

After the program voltage (Vpgm) is provided, a verification read operation may be performed so as to judge whether selected memory cells are programmed or not. If a result of the verification read operation is decided to be a verification pass, all program processes end. In contrast, if a result of verification read operation is decided to be a verification fail, a process proceeds to operation S50 for a reprogram (S40). A level of the program voltage (Vpgm) is increased so as to perform the reprogram (S50). After the operation S50, the increased program voltage is detected again (S20). As a result, a higher bit line precharge voltage (VBL<y>) and a lower pass voltage (Vpass<x>) corresponding to a level of the increased program voltage (Vpgm) are selected and provided in operation S30.

According to the program process of example embodiments, a channel boosting voltage of the program inhibited string may become high and the pass voltage (Vpass) provided to unselected word lines may become relatively low. Thus, a program disturbance and a pass disturbance may be reduced.

Figure 5:
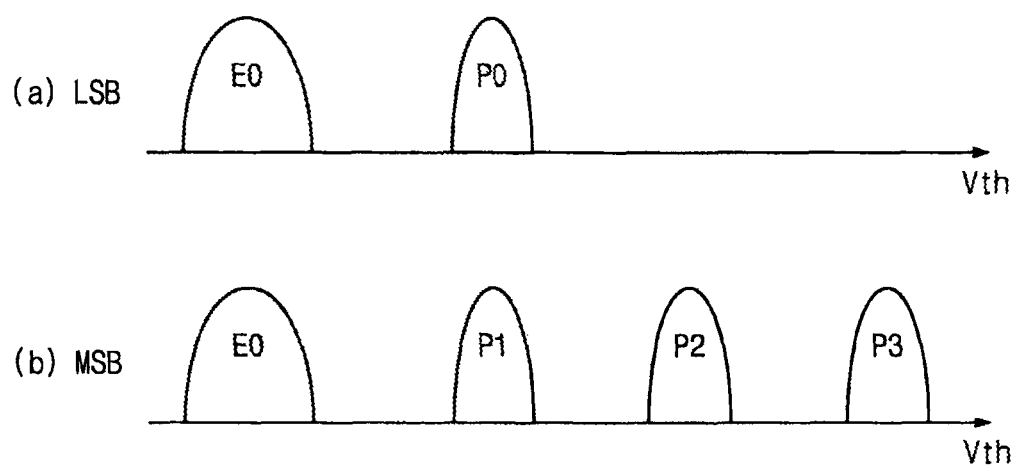
FIG. 5 is a distribution chart of a threshold voltage of MLC for illustrating a program method according to example embodiments.

FIG. 5 is a distribution chart of threshold voltages of memory cells according to example embodiments. Referring to FIG. 5, a method of detecting a target state is disclosed as an embodiment for detecting a level of a program voltage (Vpgm). Also, in case of a multilevel cell (MLC), a target state may be detected by understanding whether the multilevel cell (MLC) is a LSB page program operation or MSB page program operation. That is, a relatively low program voltage may be needed in the LSB page program. In a distribution chart (a), example distributions of threshold voltages when programming the LSB page are depicted. When programming in a program state (P0) from an erase state (E0), an applied program voltage (Vpgm) may be relatively low. In a distribution chart (b), example states P1, P2 and P3 of a target threshold voltage when programming the MSB page are depicted.

Figure 6:
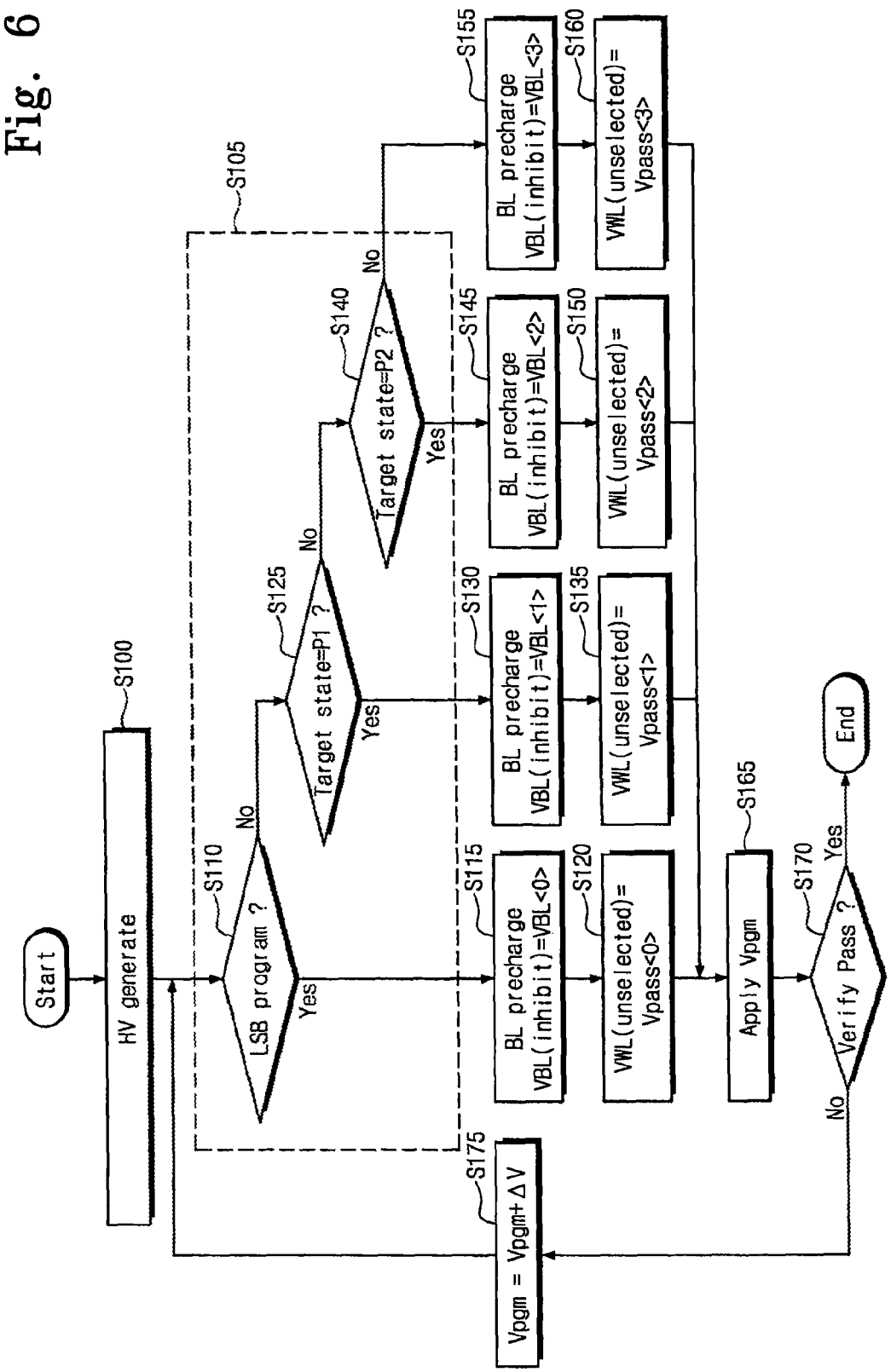
FIG. 6 is a flow chart illustrating a program method according to example embodiments.

FIG. 6 is a flow chart illustrating a program method according to example embodiments. Referring to FIG. 6, a program voltage detection method judging a level of a program voltage to be provided from a current program operation based on a target state is disclosed.

When a program operation begins, a high voltage is generated by the high voltage generator 150 (S100). Subsequently, a level of the program voltage (Vpgm) to be provided to the selected word line from the current program operation is detected by the controller 140. In the program method illustrated in FIG. 6, a detection of the level of the program voltage is embodied through a current program operation or an operation of checking a target state of a program loop in operations S110~S160 because, in the current program operation, a level of the program voltage applied to the selected word line may be graded according to a target state at which memory cells are programmed. Also, in a multilevel cell memory, a level of the program voltage applied to the selected word line may become different according to whether a page being programmed is a LSB page or a MSB page. The program method illustrated in FIG. 6 will be described with reference to a 2-bit MLC.

In an operation detecting a level of the program voltage (Vpgm) by checking a target state, the controller 140 first judges whether a program page to be programmed is a LSB page or not. If data programmed in the current program operation corresponds to a LSB page, the process moves to operation S115. In contrast, if data programmed in the current program operation corresponds to a MSB page, a process moves to operation S125 judging which target state of the MSB page corresponds to programmed target state (S110).

If data programmed in the current program operation corresponds to a LSB page, the controller 140 selects a bit line precharge VBL<0> among a bit line precharge voltages VBL<y> and apply the selected precharge voltage to a bit line of a program inhibited string (S115). Subsequently, a pass voltage (Vpass<0>) is applied to unselected word lines (S120). Selected memory cells are programmed by providing a program voltage (Vpgm) provided from the high voltage generator 150 (S165).

If data programmed in the current program operation corresponds to a MSB page, the controller 140 moves to the operation S125 and checks a target state of the current program operation. If a current target state is a target state P1, the controller 140 applies a bit line precharge voltage VBL<1> to the bit line of the program inhibited string (S130). Subsequently, a pass voltage Vpass<1> is applied to unselected word lines (S135). Selected memory cells are programmed by providing the program voltage Vpgm provided from the high voltage generator 150 (S165). If a current target state is not a target state P1, the controller 140 moves to a operation S140 and checks a target state of the current program operation. If a target state is a target state P2, the controller 140 selects and applies a bit line precharge voltage VBL<2> to the bit line of the program inhibited string (S145). Subsequently, a pass voltage Vpass<2> is applied to unselected word lines (S150). Selected memory cells are programmed by providing a program voltage Vpgm provided from the high voltage generator 150 (S165). If a target state of the current program operation is not a target state P2, the target state of the current program operation is determined to be a target state P3. The controller 140 selects and applies a bit line precharge VBL<3> to the bit line of the program inhibited string (S155). Subsequently, a pass voltage Vpass<3> is applied to unselected word lines (S160). Selected memory cells are programmed by providing a program voltage Vpgm provided from the high voltage generator 150 (S165).

As described above, a bit line precharge voltage and a pass voltage are variably provided according to a target state of memory cells being programmed. After a program voltage Vpgm is provided, a verification read operation verifying whether selected memory cells are correctly programmed or not is performed. If verification read result is a verification pass, the program process is over. In contrast, if the verification read result is a verification fail, the process moves to an operation S175 for a reprogram (S170).

A level of the program voltage Vpgm is increased by a step voltage ΔV to perform a reprogram (S175). Also, the bit line precharge voltage and the unselected word line voltage corresponding to a level of the increased program voltage (Vpgm+ΔV) are provided during the reprogram operation.

With respect to the program method illustrated in FIG. 6, the process of detecting a level of the program voltage Vpgm was described with reference to page address (a MSB page or a LSB page) of memory cells to be programmed or through a detection of a target state. Here, bit line precharge voltages (VBL<0>, VBL<1>, VBL<2>, VBL<3>) represent different levels respectively. If a target state is high, bit line precharge voltages (VBL<0>, VBL<1>, VBL<2>, VBL<3>) may be set so that a higher bit line precharge voltage is provided. Also, pass voltages (Vpass<0>, Vpass<1>, Vpass<2>, Vpass<3>) provided to the unselected word line represent different levels respectively. If a target state is high, pass voltages (Vpass<0>, Vpass<1>, Vpass<2>, Vpass<3>) may be set so that a higher pass voltage is provided. Unselected word line voltages (Vpass<0>, Vpass<1>, Vpass<2>, Vpass<3>) may, for example, be pass voltages having different levels.

Figure 7:
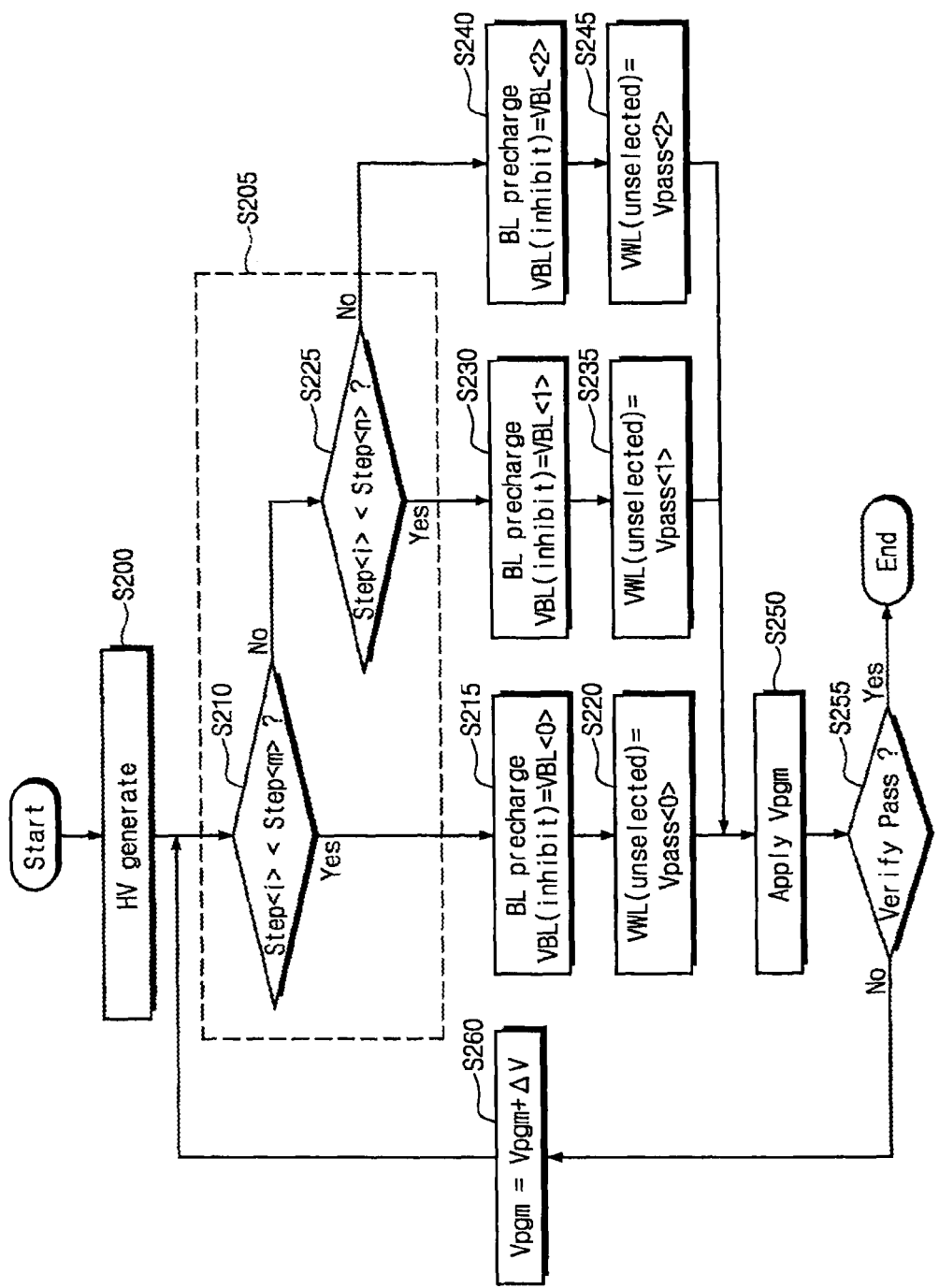
FIG. 7 is a flow chart illustrating a program method according to example embodiments.

FIG. 7 is a flow chart illustrating a program method according to example embodiments. Referring to FIG. 7, a detection method judging a level of a program voltage provided for a current program operation by referring to a step number (step<i>) set in the high voltage generator 50 is disclosed. The step number (step<i>) may represent a value of a level from a lower limit to an upper limit of a program voltage (Vpgm) provided for a program operation which is divided into a plurality of steps. Thus, a magnitude of the step number may correspond to a level of a program voltage.

When a program operation begins, a high voltage is first generated by the high voltage generator 150 (S200). Subsequently, a level of the program voltage (Vpgm) to be provided to a selected word line from a current program operation by the controller 140 is detected. According to example embodiments, a detection of a level of the program voltage (Vpgm) may be embodied based on the step number (step<i>) of the program voltage corresponding to the current program operation or a program loop. According to example embodiments, in operations S210~S245, a bit line precharge voltage and a pass voltage are selected by comparing the step number (step<i>) of a program voltage to be provided to the selected word line from the current program operation with a reference step number and referring the results.

It is determined whether the step number (step<i>) corresponding to the program voltage (Vpgm) provided for the current program operation or the program loop is greater or less than a reference step number (step<m>) (S210). If the step number of the program voltage corresponding to the current program operation is less than the specified step number (step<m>), the process moves to operation S215. In contrast, if the step number of the program voltage corresponding to the current program operation is equal to or greater than the specified step number (step<m>), the process move to operation S225 for comparing the step number (step<i>) of the current program voltage with the specified step number (step<n>, n>m) (S210).

If the step number (step<i>) of the current program voltage is less than the specified step number (step<m>), the controller 140 applies a bit line precharge voltage VBL<0> to a bit line of the program inhibited string (S215). Subsequently, a pass voltage Vpass<0> is applied to unselected word lines (S220). Selected memory cells are programmed by providing the program voltage Vpgm provided from the high voltage generator 150 (S250).

In contrast, if the step number (step<i>) of the current program voltage is equal to or greater than the specified step number (step<m>), the process moves to a step (S225) for comparing the step number (step<i>) of the current program voltage with the specified step number (step<n>, n>m). If the step number (step<i>) of the current program voltage is less than the specified step number (step<n>), the controller 140 applies a bit line precharge voltage VBL<1> to the bit line of the program inhibited string (S230). Subsequently, a pass voltage Vpass<1> is applied to unselected word lines (S235). Selected memory cells are programmed by providing the program voltage Vpgm provided from the high voltage generator 150 (S250).

In operation S225, if the step number (step<i>) of the program voltage in the current program operation is equal to or greater than the specified step number (step<n>), the controller 140 selects and applies a bit line precharge voltage VBL<2> to the bit line of the program inhibited string (S240). Subsequently, a pass voltage Vpass<2> is applied to unselected word lines (S245). Selected memory cells are programmed by providing the program voltage Vpgm provided from the high voltage generator 150 (S250).

After the program voltage Vpgm is provided, a verification read operation is may be performed so as to judge whether selected memory cells are programmed or not. If a result of verification read operation is decided to be a verification pass, all the process end. In contrast, if a result of verification read operation is decided to be a verification fail, the process moves to operation S260 for a reprogram (S255). A level of the program voltage Vpgm is increased by a step voltage ΔV so as to perform the reprogram. A bit line precharge voltage and a pass voltage corresponding to a level of the increased program voltage Vpgm+ΔV may be provided during the reprogram operation S260.

With respect to the program method illustrated in FIG. 6, the process of detecting a level of the program voltage Vpgm in the current program operation was described with reference to the step number (step<i>) of the program voltage. Here, bit line precharge voltages (VBL<0>, VBL<1>, VBL<2>) represent different levels respectively. A high bit line precharge voltage (VBL<0>, VBL<1>, VBL<2>) may be selected so that a higher bit line precharge voltage is provided if a program voltage corresponds to a high step number (step<i>). Also, pass voltages (Vpass<0>, Vpass<1>, Vpass<2>) may represent different levels respectively. For example, a high pass voltage (Vpass<0>, Vpass<1>, Vpass<2>) may be selected so that a high unselected word line voltage is provided if a program voltage corresponds to a high step number (step<i>).

Figure 8:
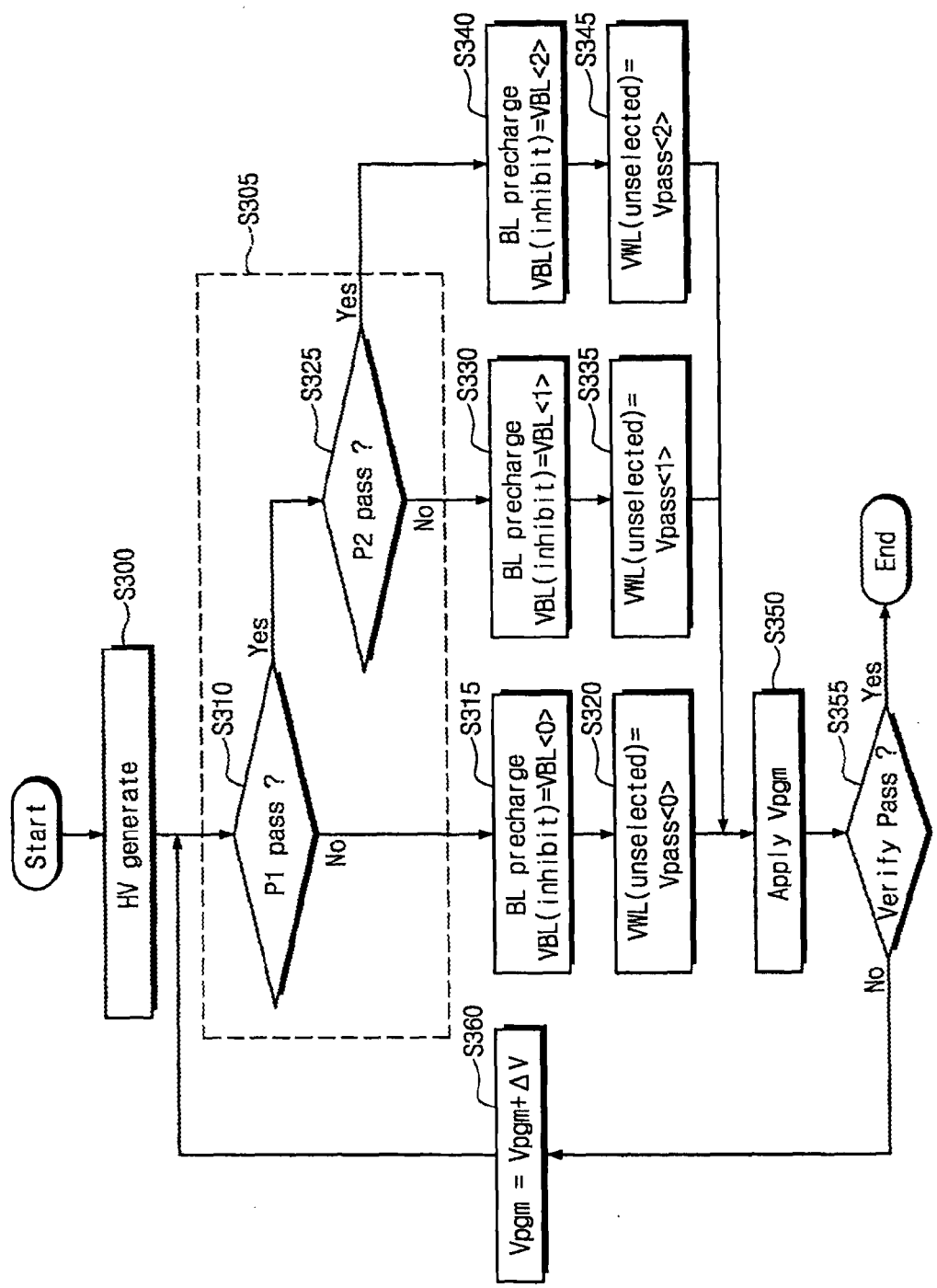
FIG. 8 is a flow chart illustrating a program method according to example embodiments.

FIG. 8 is a flow chart illustrating a program method according to example embodiments. The program method illustrated in FIG. 8 may include judging a level of a program voltage provided from a current program operation by referring to a disclosed verification read result. Generally, memory cells may be programmed in a plurality of target states during one program cycle in an operation programming a multilevel cell. That is, memory cells may not be programmed in any one target state but memory cells may be simultaneously programmed to have different target states, for example P2 and P3. Memory cells having target states P1, P2 and P3 may also be simultaneously programmed. According to example embodiments, if memory cells programmed in a low target state (e.g., P1) do not pass a program verification operation, a lower level of a program voltage may be provided to the memory cells. However, in an operation that memory cells among memory cells corresponding to target states (P1, P2) to be simultaneously programmed are program passed and memory cells among memory cells having a high target state (P3) are programmed, a relatively high voltage level of a program voltage may be provided. A bit line precharge voltage and a pass voltage may be varied by referring to a verification read result. Thus, an object of example embodiments may be accomplished. For convenience, the programming method illustrated in FIG. 8 will be explained with reference to a case where memory cells are simultaneously programmed in target states P1, P2 and P3.

When a program operation begins, a high voltage is first generated by the high voltage generator 150 (S300). Subsequently, a level of a program voltage Vpgm to be provided to a selected word line from a current program operation by the controller 140 is detected. In the program method illustrated in FIG. 8, a level detection of a program voltage Vpgm is embodied by a verification read result in operations S310-S345. A level of a program voltage provided from a current program operation (or, a program loop) is detected by referring to which target state is passes a program verification from a verification read result performed in a previous program operation (or, a program loop). A bit line precharge voltage VBL<y> and a pass voltage Vpass<x> which will be provided to an unselected word line may be selected according to a detected result.

First, verification read result performed before a current program operation or a program loop may judge whether memory cells programmed at a target state P1 are correctly programmed or not (S310). If a current program operation is a first program loop, the process moves to operation S315. Also, if a verification read result is performed before a current program operation and all the memory cells are not programmed at a target state P1, the process moves to a operation S315. In contrast, if all the memory cells to be programmed at a target state P1 are completely programmed, the process moves to operation S325 for detecting a verification read result with respect to a target state P2.

If all the memory cells are not programmed at a target state P1, the controller 140 selects and applies a bit line precharge VBL<0> to a bit line of a program inhibited string (S315). Subsequently, a pass voltage Vpass<0> is applied to unselected word lines (S320). Selected memory cells are programmed by providing a program voltage Vpgm provided from the high voltage generator 150 to a selected word line (S350).

If all the memory cells are programmed at a target state P1, the process moves to operation S325 for detecting a verification read result with respect to a target state P2. At operation S325, if all the memory cells are not programmed at the target state P2, the process moves to a operation (S330). If it is detected that all the memory cells are not programmed at the target P2, the controller 140 applies a precharge voltage VBL<1> to a bit line of a program inhibited string (S330). Subsequently, a pass voltage Vpass<1> is applied to unselected word lines (S335). Selected memory cells are programmed by providing a program voltage Vpgm provided from the high voltage generator 150 to a selected word line (S350).

In contrast, if it is detected that all the memory cells programmed at the target state P2 are completely programmed, the controller 140 selects and applies a bit line precharge voltage VBL<2> to a bit line of a program inhibited string (S340). Subsequently, a pass voltage Vpass<2> may be applied to unselected word lines (S345). Selected memory cells may be programmed by providing a program voltage Vpgm provided from the high voltage generator 150 to a selected word line (S350).

After a program voltage Vpgm is provided, a verification read operation verifying whether selected memory cells are programmed or not is performed. If a result of verification read operation is decided to be a verification pass, all program processes end. In contrast, if a result of verification read operation is decided to be a verification fail, the process moves to operation S360 for a reprogram (S355). A level of a program voltage Vpgm is increased by a operation voltage Δ so as to perform the reprogram (S360). A bit line precharge voltage and a pass voltage corresponding to a level of the increased program voltage Vpgm+Δ are provided during the reprogram operation.

With respect to the program method illustrated in FIG. 6, the process of detecting a level of a program voltage Vpgm by referring to a verification read result was described. Here, bit line precharge voltages (VBL<0>, VBL<1>, VBL<2>) being provided to a bit line represent different levels respectively. The bit line precharge voltages (VBL<0>, VBL<1>, VBL<2>) may be set so that a higher bit line precharge voltage is provided as a program voltage will be provided after memory cells to be programmed at a high target state P2 are decided to be a pass. Also, pass voltages (Vpass<0>, Vpass<1>, Vpass<2>) represent different levels respectively. For example, the pass voltages (Vpass<0>, Vpass<1>, Vpass<2>) may be set so that a high pass voltage is provided as a program voltage will be provided after memory cells programmed at a high target state (P2) are decided to be a pass.

Figure 9:
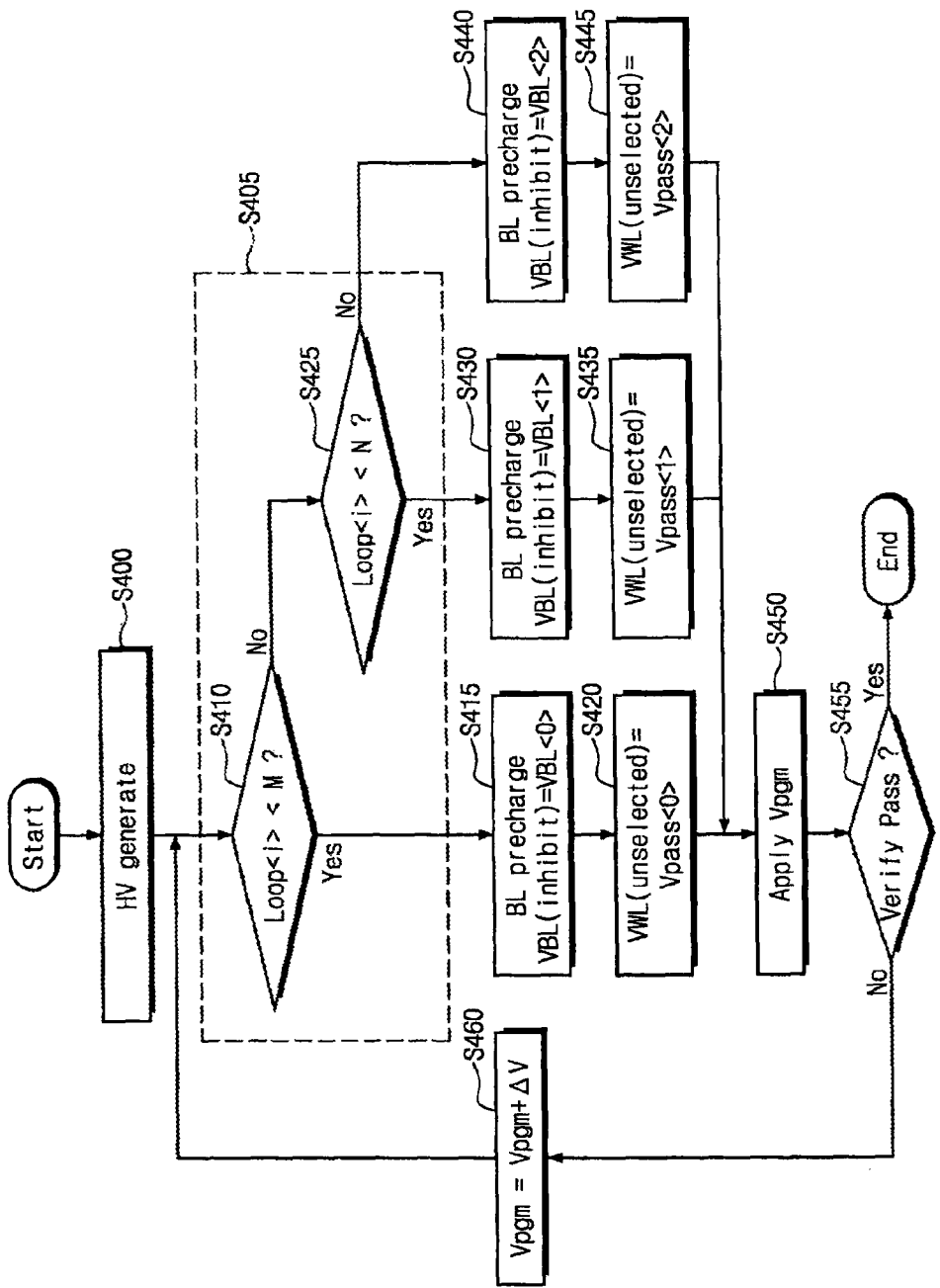
FIG. 9 is a flow chart illustrating a program method according to example embodiments.

FIG. 9 is a flow chart illustrating a program method according to example embodiments. The program method illustrated in FIG. 9 includes a detecting method which judges a level of a program voltage provided for a current program operation by referring to a program loop number (Loop<i>). The program loop number (Loop<i>) includes a program section providing a program voltage and a verification section verifying a program result. The program and the verification section constitute a program loop. A program loops are repeated until all the selected memory cells are programmed. Thus, a magnitude of the program loop number (Loop<i>) may correspond to information on a level of a program voltage Vpgm.

When a program operation begins, a high voltage is generated by the high voltage generator 150 (S100). Subsequently, a level of a program voltage Vpgm to be provided to a selected word line for a current program operation is detected by the controller 140. In the program method illustrated in FIG. 9, a level detection of the program voltage Vpgm is performed by referring to the program loop number corresponding to a current program operation or a program loop. According to example embodiments, in steps S410-S445, a bit line precharge voltage VBL<y> and a pass voltage (Vpass<i>) are selected by comparing the program loop number (Loop<i>) to be provided to the selected word line for a current program operation and referring to the result.

Whether the loop number (Loop<i>) of a current program operation or a program loop is greater or less than a first specified number (M) is judged (S410). If it is judged that a program loop number Loop<i> corresponding to the current program operation is less than the specified number M, a process moves to an operation S415. In contrast, if it is judged that the program loop number (Loop<i>) corresponding to the current program operation is equal to or greater than the specified number (M), a process moves to operation S225 for comparing a current program loop number (Loop<i>) and a second specified number (N, N>M) (S410).

If it is judged that the program loop number (Loop<i>) in a current program operation is less than the specified number (M), the controller 140 selects and applies a bit line precharge voltage VBL<0> to a bit line of a program inhibited string (S415). Subsequently, a pass voltage Vpass<0> is applied to unselected word lines (S420). Selected memory cells are programmed by providing a program voltage Vpgm provided from the high voltage generator 150 to a selected word line (S450).

In contrast, if it is judged that the program loop number (Loop<i>) in a current program operation is equal to or greater than the specified number (M), the process moves to operation S425 for comparing a current program loop number (Loop<i>) and a specified number (N, N>M). If it is judged that the program loop number (Loop<i>) in a current program operation is less than the specified number (M), the controller 140 applies a precharge voltage (VBL<1>) to a bit line of a program inhibited string (S430). Subsequently, a pass voltage (Vpass<1>) is applied to unselected word lines (S430). Selected memory cells are programmed by providing a program voltage (Vpgm) provided from the high voltage generator 150 to a selected word line (S450).

At operation S425, if it is judged that the program loop number (Loop<i>) in a current program operation is equal to or greater than the second specified number (N), the controller 140 selects and applies a precharge voltage VBL<2> to a bit line of a program inhibited string (S440). Subsequently, a pass voltage (Vpass<2>) is applied to unselected word lines (S445). Selected memory cells are programmed by providing a program voltage (Vpgm) provided from the high voltage generator 150 to a selected word line (S450).

After a program voltage (Vpgm) is provided, a verification read operation is performed so as to judge whether selected memory cells are programmed or not. If a result of verification read operation is decided to be a verification pass, all program processes end. In contrast, if a result of verification read operation is decided to be a verification fail, the process move to operation S460 for a reprogram (S455). A level of a program voltage (Vpgm) is increased by a operation voltage (ΔV) so as to perform the reprogram (S460). A bit line precharge voltage and an unselected word line voltage corresponding to a level of the increased program voltage (Vpgm+ΔV) are provided during the reprogram operation.

With respect to the program method illustrated in FIG. 9, the process of detecting a level of a program voltage (Vpgm) in a current program operation was explained with reference to a program loop number (Loop<i>). Here, bit line precharge voltages (VBL<0>, VBL<1>, VBL<2>) being provided to a bit line represent different levels respectively. The bit line precharge voltages (VBL<0>, VBL<1>, VBL<2>) may be set so that a higher bit line precharge voltage is provided as a program voltage corresponds to a high program loop number (Loop<i>). Also, pass voltages (Vpass<0>, Vpass<1>, Vpass<2>) being provided to an unselected word line may represent different levels respectively. For example, the pass voltages (Vpass<0>, Vpass<1>, Vpass<2>) may be set so that a high pass voltage is provided as a program voltage corresponds to a high program loop number (Loop<i>).

Figure 10:
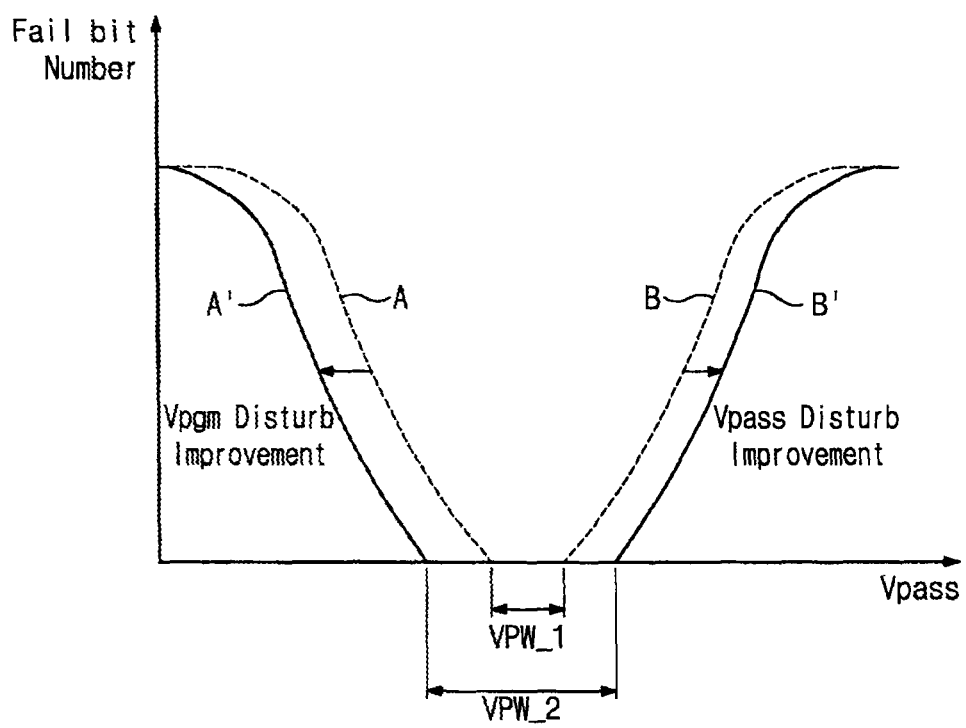
FIG. 10 is a graph illustrating an effect on program disturbance and pass disturbance according to example embodiments.

FIG. 10 is a graph illustrating an effect of example embodiments on program disturbance and pass disturbance. FIG. 10 illustrates improvements in the program disturbance and pass disturbance.

First, a curve A represents a degree of a soft program or a number of a fail bits generated by memory cells (e.g., 116 of FIG. 2) included in a program inhibited string and receiving a program voltage Vpgm. However, a boosting effect of a channel voltage may be raised by providing a bit line precharge voltage varied according to a level of a program voltage Vpgm, in accordance with example embodiments. Thus, a curve A moves to a curve A'.

A curve B represents a degree of a soft program or a number of fail bits generated by memory cells connected to unselected word lines among memory cells included in a program string. With the method of providing a pass voltage Vpass according to example embodiments, pass voltages having various levels can be selectively provided depending on a level of a program voltage Vpgm. Thus, the curve B moves to a curve B'. Consequently, a pass voltage window VPW_2 according to example embodiments may be obtained. It means that the pass voltage window VPW_2 according to example embodiments is extended compared with a pass voltage window VPW_1 of when a bit line precharge voltage and a pass voltage level which are not varied are applied.

Figure 11:
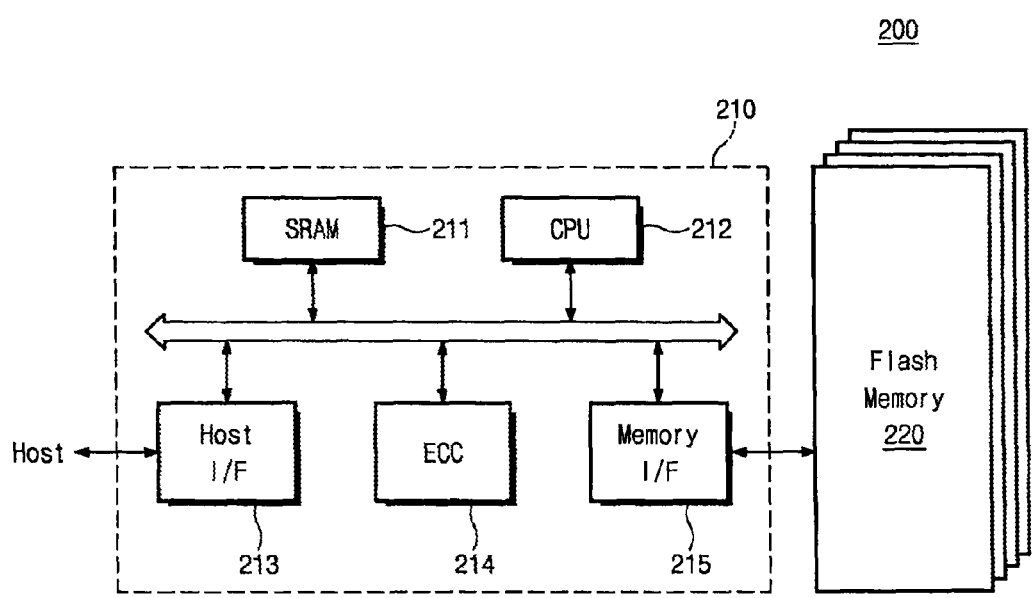
FIG. 11 is a block diagram of a memory system according to example embodiments.

FIG. 11 is a block diagram of a memory system 200 including a flash memory device 220 performing a program operation according to example embodiments. Referring to FIG. 11, the memory system 200 may include the flash memory device 220 and a memory controller 210. The flash memory device 220 is the same as or substantially identical to the flash memory device 100 depicted in FIG. 1. The memory controller 210 may control the flash memory device 220. The flash memory device 220 may be combined with the memory controller 210 to provide a memory card or a solid state disk (SSD).

A SRAM 211 may be used as an operation memory of a central processing unit (CPU) 212. A host interface 213 may include a data exchange protocol of a host connected to the memory system 200. An error correction block 214 detects and corrects errors included in data read from the flash memory device 220. A memory interface 214 interfaces with the flash memory device 220. The central processing unit 212 performs all the control operation for data exchange of the memory controller 210. The memory system 200 may further include a ROM (not shown) storing a code data for interfacing with a host. The flash memory device 220 may be provided as a multi chip package comprised of a plurality of flash memory chips.

The memory system 200 may be provided as a storage medium of high reliability having a low probability of error occurrence. The flash memory device according to example embodiments may be provided to a memory system such as a solid state disk (SSD). In this case, the memory controller 210 may communicate with the outside (e.g., a host) through one of various interface protocols such as USB, MMC, PCI-E, SATA, PATA, SCSI, ESDI and IDE.

A flash memory device is a nonvolatile memory device that can retain stored data even when its power supply is interrupted. As uses of mobile devices such as a cell phone, PDA digital camera, a portable game consol and MP3P increase, a flash memory device is widely used as not only a data storage but also a code storage. A flash memory device may also be used in a home application such as HDTV, DVD, router and GPS.

Figure 12:
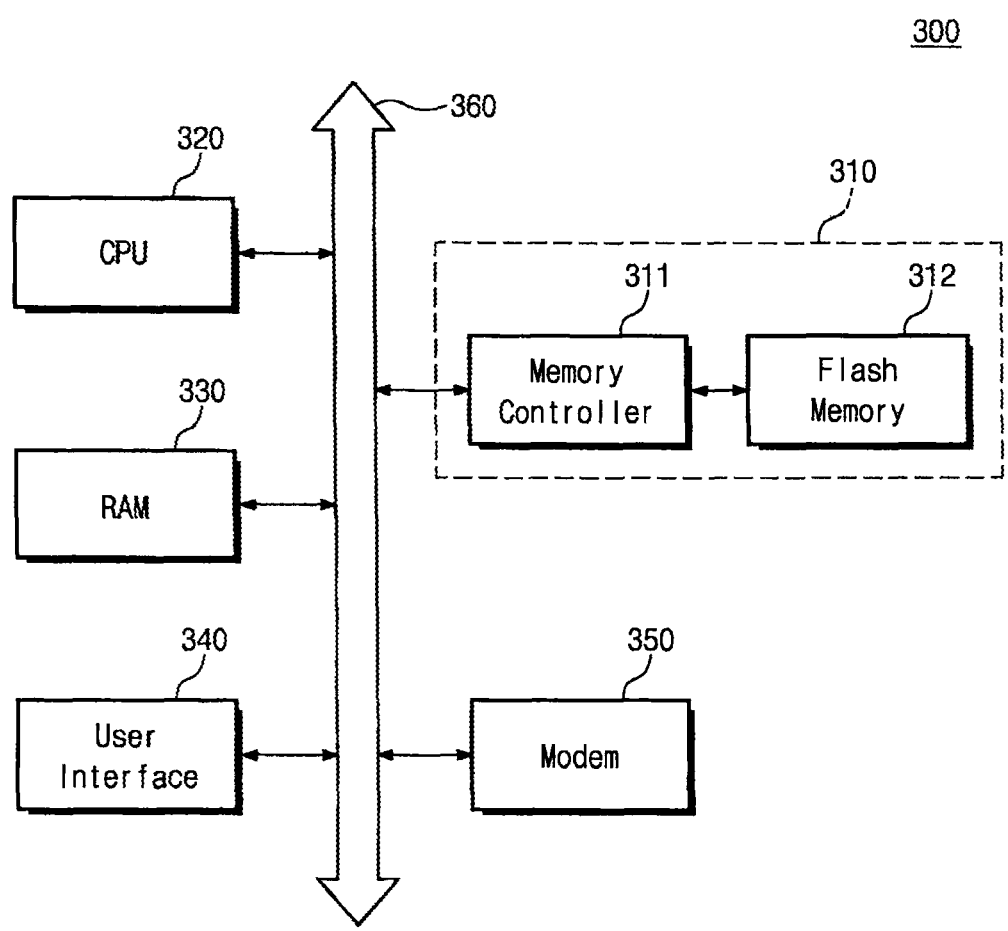
FIG. 12 is a block diagram of a computing system according to example embodiments.

A computing system 300 including a flash memory device 312 according to example embodiments is depicted in FIG. 12. The computing system 300 may include a microprocessor 320 electrically connected to a system bus 360, a RAM 330, a user interface 340, a modem 350 such as a base band chipset and a memory system 310. The memory system 310 is the same as or substantially identical to the memory system 200 depicted in FIG. 11. When the computing system 300 is a mobile device, a battery (not shown) for supplying an operation voltage of the computing system 300 may be further provided. The computing system 300 may further include an application chipset, a camera image processor (CIS), a mobile DRAM or the like. The memory system 310 may be comprised of a solid state disk (SSD) using a nonvolatile memory to store data. Also, the memory system 310 may be provided as a fusion flash memory (e.g., a one NAND flash memory). A flash memory device and/or a memory controller according to example embodiments may be mounted using various type packages. For example, the flash memory device and/or the memory controller according to example embodiments may be mounted using packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flatpack (TQFP), small outline (SOIC), shrink small outline package (SSOP), thin small outline (TSOP), thin quas flatpack (TQFP), system in package (SIP), multi chip package (MCP), wafer-level fabricated package (WFP), wafer-level processed stack package (WSP).

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A method of operating a nonvolatile memory device including a plurality of memory blocks, each of the plurality of memory blocks including multi-level memory cells coupled to word lines and bit lines, the method comprising:
performing a first program operation on selected memory cells coupled to a selected word line using a first Incremental Step Pulse Program (ISPP) scheme, the first program operation including,
applying a first pass voltage to an unselected word line during a first program period;
applying a second pass voltage higher than the first pass voltage to the unselected word line during a second program period following the first program period; and
applying a third pass voltage higher than the second pass voltage to the unselected word line during a third program period following the second program period, wherein
the first program period includes at least two program loops, each of the second program period and the third program period includes at least one program loop, and
memory cells coupled to the unselected word line and the selected memory cells coupled to the selected word line are included in a same memory block among the plurality of memory blocks.

2. The method of claim 1, wherein the first program operation is a most significant bit (MSB) page program operation.

3. The method of claim 1, further comprising:
performing a second program operation on the selected memory cells coupled to the selected word line using a second ISPP scheme,
wherein the second program operation is a least significant bit (LSB) page program operation.

4. The method of claim 3, wherein the second program operation is followed by the first program operation.

5. The method of claim 3, wherein the performing a second program operation includes applying a fourth pass voltage to the unselected word line during a fourth program period.

6. The method of claim 5, wherein the fourth pass voltage is equal to the first pass voltage.

7. The method of claim 5, wherein the fourth pass voltage is different from the first pass voltage.

8. A method of operating a nonvolatile memory device including a plurality of memory blocks, each of the plurality of memory blocks including multi-level memory cells coupled to word lines and bit lines, the method comprising:
- applying a program voltage to a selected word line coupled to first memory cells and second memory cells among the multi-level memory cells;
- applying a first pass voltage to an unselected word line until programming the first memory cells into a first target state is completed; and
- applying a second pass voltage higher than the first pass voltage to the unselected word line after the programming the first memory cells into the first target state is completed,
- wherein memory cells coupled to the unselected word line and the first memory cells are included in a same selected memory block among the plurality of memory blocks.

9. The method of claim 8, further comprising:
- applying the second pass voltage to the unselected word line until programming the second memory cells into a second target state is completed; and
- applying a third pass voltage higher than the second pass voltage to the unselected word line after the programming the second memory cells into the second target state is completed.

10. A method of operating a nonvolatile memory device including a plurality of memory blocks, each of the plurality of memory blocks including multi-level memory cells coupled to word lines and bit lines, the method comprising:
- performing a least significant bit (LSB) page program operation on selected memory cells coupled to a selected word line using a first Incremental Step Pulse Program (ISPP) scheme, the LSB page program operation including applying a first pass voltage to an unselected word line;
- performing a most significant bit (MSB) page program operation on the selected memory cells coupled to the selected word line using a second ISPP scheme, the MSB page program operation including,
  - applying a second pass voltage higher than the first pass voltage to the unselected word line during a first program loop;
  - applying a third pass voltage higher than the second pass voltage to the unselected word line during a second program loop following the first program loop; and
  - applying a fourth pass voltage higher than the third pass voltage to the unselected word line during a third program loop following the second program loop,
- wherein memory cells coupled to the unselected word line and the selected memory cells are included in a same selected memory block among the plurality of memory blocks.

* * * * *